(12) United States Patent
Jun et al.

(10) Patent No.: US 10,666,152 B2
(45) Date of Patent: May 26, 2020

(54) VALLEY AND PEAK DETECTION FOR SWITCHING POWER CONVERTER

(71) Applicant: DIALOG SEMICONDUCTOR INC., Campbell, CA (US)

(72) Inventors: Henry Jun, Campbell, CA (US); Chuanyang Wang, Campbell, CA (US)

(73) Assignee: DIALOG SEMICONDUCTOR INC., Campbell, CA (US)

( * ) Notice: Subject to any disclaimer, the term of this patent is extended or adjusted under 35 U.S.C. 154(b) by 0 days.

(21) Appl. No.: 15/966,497

(22) Filed: Apr. 30, 2018

(65) Prior Publication Data
US 2019/0058450 A1 Feb. 21, 2019

Related U.S. Application Data

(60) Provisional application No. 62/545,957, filed on Aug. 15, 2017.

(51) Int. Cl.
| | | |
|---|---|---|
| *H02M 3/335* | (2006.01) | |
| *G01R 1/40* | (2006.01) | |
| *G01R 19/04* | (2006.01) | |
| *G01R 19/175* | (2006.01) | |
| *H02M 1/00* | (2006.01) | |

(52) U.S. Cl.
CPC ............ *H02M 3/3353* (2013.01); *G01R 1/40* (2013.01); *G01R 19/04* (2013.01); *G01R 19/175* (2013.01); *H02M 3/33569* (2013.01); *H02M 3/33592* (2013.01); *H02M 2001/0003* (2013.01); *H02M 2001/0058* (2013.01)

(58) Field of Classification Search
CPC ........ H02M 1/00; H02M 3/06; H02M 3/3353; H02M 2001/0003; H02M 2001/0009; H02M 2001/0025; H02M 2001/0048; H02M 2001/0054; H02M 2001/0058; H02M 1/08; H02M 1/083; H02M 3/24; H02M 3/335; H02M 3/33507; H02M 3/33523; H02M 3/33569; G01R 1/40; G01R 19/04; G01R 19/175; H03H 7/18
See application file for complete search history.

(56) References Cited

U.S. PATENT DOCUMENTS

| | | | | |
|---|---|---|---|---|
| 5,455,757 A | * | 10/1995 | Nguyen | ............ H02M 3/33569 363/20 |
| 9,832,772 B2 | * | 11/2017 | Kwon | ............... H04W 72/0446 |
| 2009/0040796 A1 | * | 2/2009 | Lalithambika | .... H02M 3/33507 363/21.17 |

(Continued)

OTHER PUBLICATIONS

C.-C. Chiu, et al., "Self-Calibrated Knee Voltage Detector With 99.65% High Accuracy for AC Charger System in 0.5 μm 500 V UHV Process," IEEE Transactions in Circuits and Systems I: Regular Papers, vol. 61, No. 10, pp. 2786-2795, Oct. 2014.

(Continued)

*Primary Examiner* — Gustavo A Rosario-Benitez
(74) *Attorney, Agent, or Firm* — Haynes and Boone, LLP (57) ABSTRACT

A switching power converter is provided with a phase-shifting RC network for phase-shifting a divided version of a drain voltage of a power switch transistor into a phase-shifted voltage. A comparator compares the phase-shifted voltage to a DC bias voltage to detect peaks and valleys during resonant oscillations of the drain voltage of the power switch transistor.

15 Claims, 5 Drawing Sheets

(56) References Cited

U.S. PATENT DOCUMENTS

| | | | |
|---|---|---|---|
| 2009/0206808 A1* | 8/2009 | Wrathall | H02M 3/1588 |
| | | | 323/282 |
| 2010/0091525 A1* | 4/2010 | Lalithambika | H02M 1/08 |
| | | | 363/21.02 |
| 2015/0263628 A1* | 9/2015 | Russell | H02M 3/156 |
| | | | 363/21.03 |
| 2015/0303806 A1* | 10/2015 | Madsen | H02M 7/5383 |
| | | | 323/271 |
| 2016/0105104 A1* | 4/2016 | Hwang | H02M 3/156 |
| | | | 323/235 |
| 2016/0111955 A1* | 4/2016 | Hwang | H02M 3/156 |
| | | | 323/235 |
| 2016/0111962 A1* | 4/2016 | Mao | H02M 3/33507 |
| | | | 363/21.16 |
| 2016/0301309 A1* | 10/2016 | Tateishi | H02M 3/158 |
| 2017/0288551 A1* | 10/2017 | Hwang | H02M 3/33523 |
| 2018/0076725 A1* | 3/2018 | Xue | H02M 1/083 |

OTHER PUBLICATIONS

M. A. Al-Alaoui, "A unified analog and digital design to peak and valley detector, window peak and valley detectors, and zero-crossing detectors," IEEE Transactions on Instrumentation and Measurement, vol. 35, No. 3, pp. 304-307, Sep. 1986.

* cited by examiner

VALLEY AND PEAK DETECTION FOR SWITCHING POWER CONVERTER

CROSS-REFERENCE TO RELATED APPLICATIONS

This application claims the benefit of and priority to U.S. Provisional Application No. 62/545,957 filed Aug. 17, 2017.

TECHNICAL FIELD

This application relates to switching power converter controllers, and more particularly to valley and peak detection for switching power converters.

BACKGROUND

The high efficiency of switching power converters such as flyback converters has led to their widespread adaption as the battery charger for mobile devices. In a flyback converter, a controller controls the cycling of a power switch transistor that connects between the transformer's primary winding and ground. A rectified AC mains voltage such as from a bridge diode rectifier drives the primary winding current when the power switch is cycled on. The rectified AC mains voltage can be several hundred volts such that it can stress the power switch transistor. To minimize the switching stress for the power switch transistor, it is known to employ valley switching techniques with regard to the resonant oscillation of the drain voltage for the power switch transistor when it is cycled off. The peak voltages for the resonant oscillation can be relatively robust (as much as 200 V or higher) whereas the minimum voltages (the valleys in the resonant oscillations) are much lower.

Figure 1:
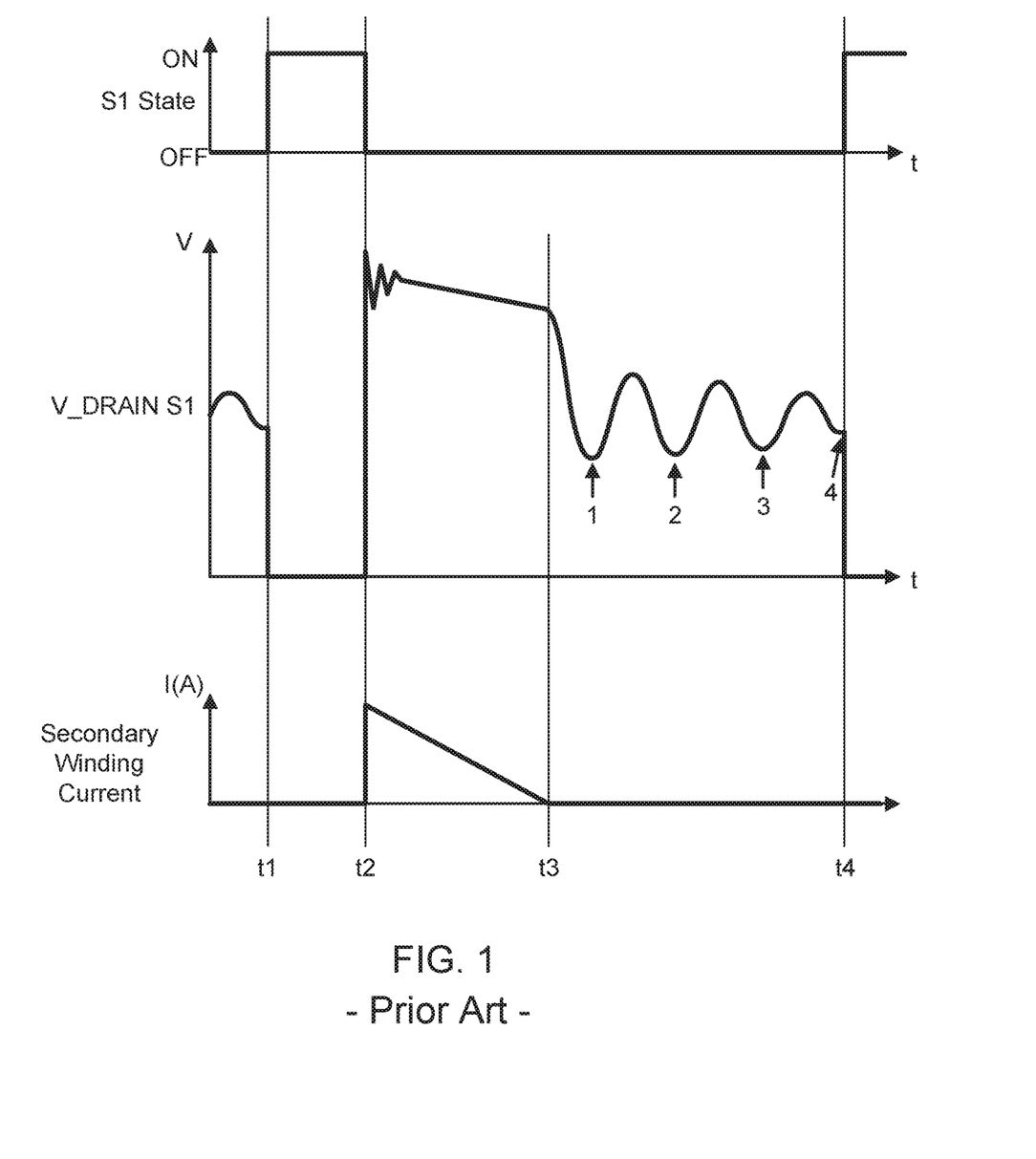
FIG. 1 illustrates some waveforms for a series of power cycles in a conventional switching power converter.

Valley mode switching may be better understood through a consideration of the waveforms shown in FIG. 1. At a time t1, a power switch transistor S1 is cycled on and then cycled off at a time t2. The drain voltage (V_DRAIN) for power switch transistor S1 is grounded while it is on. A secondary winding current does not flow while the power switch transistor S1 is on. At time t2, the drain voltage abruptly rises high in response to the cycling off of the power switch transistor S. The secondary winding current then jumps high and begins to ramp down to zero at a time t3, which is denoted as the transformer reset time. From time t2 to time t3, the drain voltage slowly declines from its high value and then drops at the transformer reset time, whereupon the drain voltage begins resonantly oscillating. Each minimum or valley in the resonant oscillation is numbered, starting from an initial valley 1 to a fourth valley 4 at a time t4. Another power switch cycle is started at time t4. But since the drain voltage equals its local minimum at valley 4, the stress to the power switch transistor S1 is minimized due to the resulting valley-mode switching. A similar reduction in stress would occur if the on-time for the power switch transistor S1 occurred at an earlier or later valley.

Although valley-mode switching thus lowers the voltage stress on the power switch transistor, note that the valley voltages are not zero but may range to 20 V or even higher such as 60 V. This relatively high drain voltage is then discharged to ground when the power switch transistor is cycled on, which lowers efficiency. A more power-efficient alternative to valley-mode switching is zero-voltage-switching (ZVS). In ZVS operation, the leakage energy in the transformer is stored and reclaimed in a capacitor that is coupled to the drain voltage of the power switch transistor through an active clamp switch. The active clamp switch is cycled on at the peak of the resonant oscillations, whereupon the drain voltage is discharged to ground as the leakage energy is reclaimed. An ZVS architecture thus has no stressing switches at the on-time of the power switch transistor.

A valley-mode controller thus needs some means of detecting the valleys in the resonant oscillations of the drain voltage whereas a ZVS controller needs a means for detecting the peaks in such resonant oscillations. In addition, a ZVS controller needs a means for detecting a zero crossing for the drain voltage. However, existing valley and peak detection schemes are prone to inaccuracies.

For example, an estimate may be made of the period T for the resonant oscillations based upon an estimate of the inductance for the primary winding and the parasitic capacitance for the power switch transistor. A valley may then be deemed to occur after a T/4 delay from the midpoint crossing of a falling edge for the resonant oscillations such as detected through a comparator. Similarly, a peak may be deemed to occur after a T/4 delay from the midpoint crossing of a rising edge for the resonant oscillations. But these parasitic elements will vary from component to component and thus from one flyback converter to another such that a fixed estimate of the period T will lead to inaccurate peak and valley detection.

Figure 2:
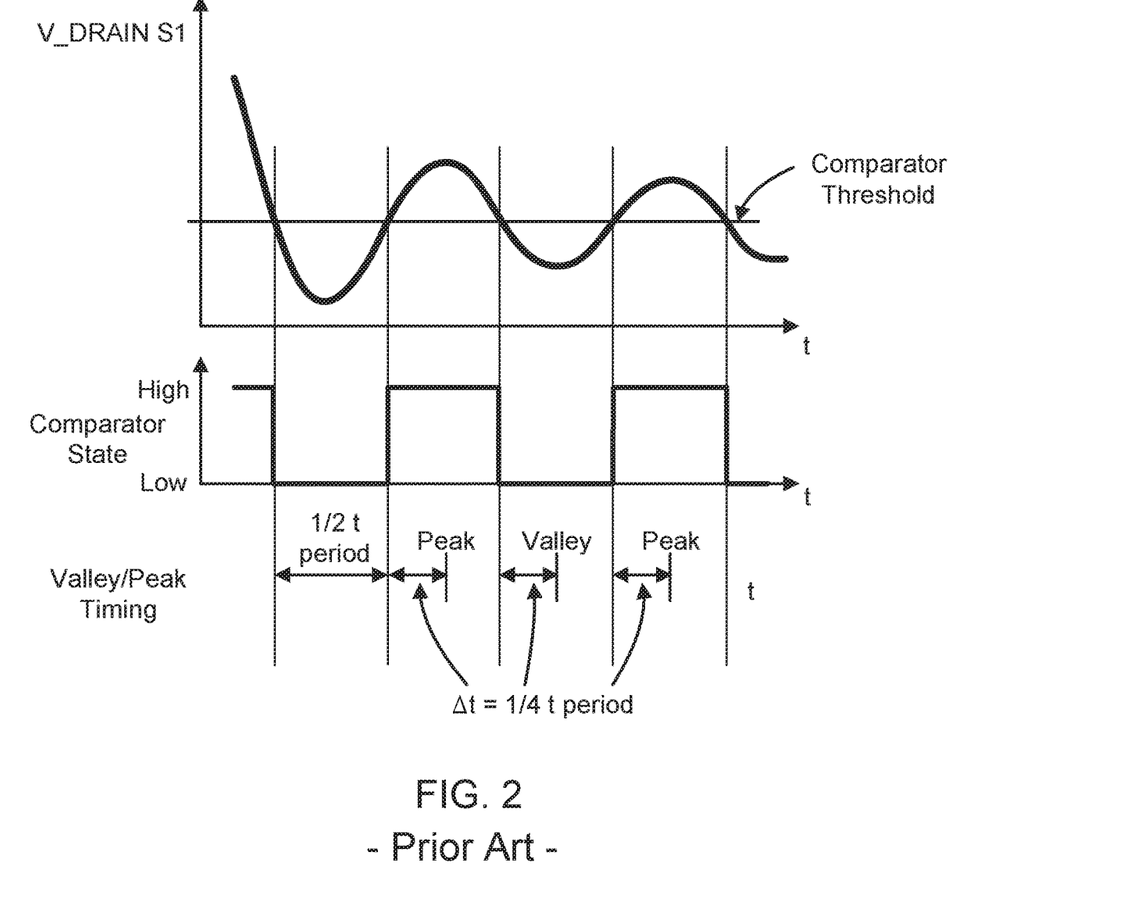
FIG. 2 illustrates the comparator output signal and drain voltage waveforms for a conventional peak and valley detection method.

It is thus known to adaptively measure the ringing frequency period for the drain voltage to estimate the peak and valley locations. Some exemplary waveforms for a conventional adaptive technique are shown in FIG. 2. A comparator compares the drain voltage to a comparator threshold voltage that equals the common-mode voltage (mid-point voltage) for the resonant ringing of the drain voltage. The low time (or the high time) for the comparator output equals ½ the resonant period T. The resulting flyback controller may thus use a counter that counts T/4 after the low transition of the comparator output signal to estimate the valley location. Conversely, the controller may estimate that a peak occurs after a delay of T/4 from the comparator rising edge. Although such an adaptive approach does not suffer from the process variations of a fixed approach, note that it requires the complexity of a counter. More fundamentally, it does not directly detect the peaks and valleys but instead estimates their location. But such an estimation assumes that the peaks and valleys are symmetric. In reality, the peaks and valleys are subject to non-linearities and noise such that even if the period T is measured accurately, the resulting estimation is prone to inaccuracies. These inaccuracies are aggravated as the switching frequency is increased in modern flyback converters because the primary winding inductance is lowered at increased switching frequencies such that the resonant oscillation period T is reduced accordingly.

Accordingly, there is a need in the art for improved valley and peak detection methods and circuits for switching power converters.

SUMMARY

To address the need in the art for improved peak and valley detection, a flyback converter is provided with a voltage divider to divide a drain voltage for a power switch transistor into a divided drain voltage. A capacitor phase-shifts the divided drain voltage by 90 degrees into a phase-shifted divided drain voltage. A first comparator compares the phase-shifted divided drain voltage to a reference voltage to form a comparator output signal that has binary transitions at the peaks and valleys in the resonant oscillation of the drain voltage for the power switch transistor.

In embodiments that practice zero-voltage switching, the voltage divider is a capacitive voltage divider formed by the drain-to-source capacitance of a high-voltage clamping transistor and a voltage-dividing capacitor. The high-voltage clamping transistor is maintained off during a peak and valley mode of operation in which the first comparator operates to detect the peaks and valleys. During ZVS operation, the high-voltage transistor is switched on so that its drain voltage is clamped at a threshold voltage below its gate voltage. A second comparator compares the clamped drain voltage to ground to detect a zero crossing point for the drain voltage of the power switch transistor. These advantageous features may be better appreciated through a consideration of the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

A circuit is provided that directly detects the peaks and valleys in the resonant ringing of the drain voltage for a power switch transistor. The inaccuracies that result from merely indirectly estimating the peak and valley locations are avoided. Moreover this direct detection is enabled using minimal complexity. For example, the peak and valley detection circuit may be implemented using a high-voltage clamping transistor, a simple RC network, and a peak/valley comparator (note that a zero-crossing comparator may be included for a detection of the zero crossing of the power switch transistor's drain voltage in ZVS operation). The RC network includes a dividing capacitor that is in series between ground and a source of the high-voltage clamping transistor. A drain of the high-voltage clamping transistor connects to a terminal of the power switch transistor. For example, the terminal may be a drain terminal if the power switch transistor is an NMOS power switch transistor. Alternatively, the terminal may be a collector terminal if the power switch transistor is a bipolar junction transistor.

Since the high-voltage clamping transistor is off during the peak and valley detection period, the drain-to-source capacitance of the high-voltage clamping transistor forms a capacitive voltage divider with the dividing capacitor. The capacitance of the dividing capacitor is relatively large compared to the drain-to-source capacitance for the high-voltage clamping transistor (e.g., approximately 50 times larger). A divided version of the drain voltage for the power switch transistor that is formed across the dividing capacitor is thus just a fraction of the drain voltage. This is quite advantageous as the drain voltage may be quite high (e.g., 300 V) at the peaks of the resonant oscillation. But the capacitive voltage divider provides a divided version that may be safely processed through the RC network and the peak/valley comparator. The peak/valley comparator thus does not require bulky thick-oxide transistors for its construction due to the division through the voltage divider.

Figure 3:
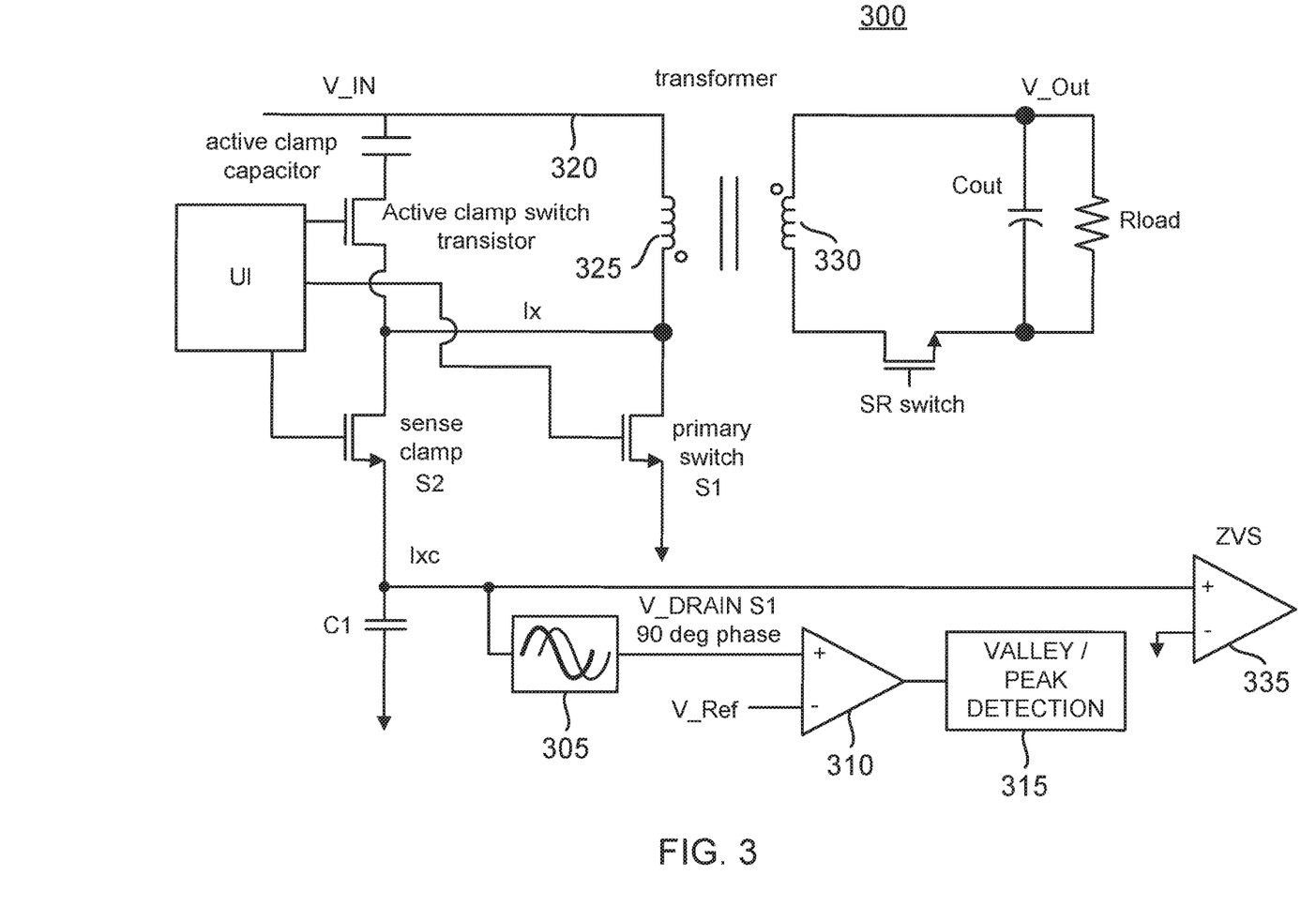
FIG. 3 is a diagram for a flyback converter configured for valley and peak detection in accordance with an embodiment of the disclosure.

The peak and valley detection period occurs after the transformer reset time. An example flyback converter 300 that includes a controller U1 configured to practice the peak and valley detection techniques disclosed herein is shown in FIG. 3. A diode bridge (not illustrated) rectifies an AC mains voltage to drive an input voltage (V_IN) on an input voltage rail 320. A primary winding 325 of a transformer couples between input voltage rail 320 and a drain of a power switch transistor S1. The source of power switch transistor S1 is tied to ground through an optional low-resistance current-sense resistor (not illustrated). A primary-side controller U1 controls the cycling of power switch transistor S1 to regulate an output voltage (V_OUT) that drives a load represented by a load resistance Rload. It will be appreciated that the regulation of the output voltage may instead be controlled by a secondary-side controller (not illustrated) in alternative embodiments. When controller U1 drives the gate of power switch transistor S1 to turn on power switch transistor S1, a magnetizing current flows through primary winding 325. A secondary winding 330 for the transformer does not conduct during this on-time for power switch transistor S1. For example, a synchronous rectifier (SR) switch transistor may be coupled in series between the load and secondary winding 330. An SR controller (not illustrated) maintains the SR switch transistor off while the power switch transistor S1 is conducting. In alternative embodiments, the SR switch transistor may be replaced by an output diode.

Flyback converter 300 is configured for ZVS operation so it includes an NMOS active clamping switch transistor that couples in series from the drain of the power switch transistor S1 to an active clamp capacitor that in turn is connected to input voltage rail 320. Controller U1 drives the gate of the active clamp switch transistor to control its operation during a ZVS mode of operation as known in the active clamping arts. In alternative embodiments, a PMOS active clamp switch may be used such that the P-channel switch would couple in series with the active clamp capacitor between ground and the drain of the power switch transistor S1. In alternative embodiments that do not practice ZVS, flyback converter 300 may omit the active clamp components. During ZVS operation, controller U1 does not cycle on the power switch transistor S1 until the zero-crossing time for the power switch transistor's drain voltage. A high-voltage clamp transistor S2 functions to clamp the power switch transistor's drain voltage to protect a zero voltage switching (ZVS) comparator 335 that detects the drain voltage zero crossing time by comparing a drain voltage 1xc for the high-voltage clamp transistor to ground. Controller U1 responds to comparator 335 driving its output high in response to the zero crossing by switching on the power switch transistor S1.

For high-speed operation, both the high-voltage clamp transistor S2 and the power switch transistor S1 may be GaN field-effect transistors. During a zero-voltage crossing detection, controller U1 maintains the high-voltage clamp transistor S2 on such that its drain voltage 1xc is clamped at a threshold voltage below its gate voltage (e.g., the drain voltage lxc may be clamped at approximately 4 V). Comparator 335 may thus be constructed with thin-oxide transistors for increased density.

During valley-mode operation, controller U1 switches off high-voltage clamp transistor S2. After the transformer reset time, the drain voltage lx for the power switch transistor S1 will begin resonantly ringing (which is also designated herein as resonantly oscillating) to commence the peak and valley detection period. The drain-to-source capacitance for the high-voltage clamping transistor S2 forms a voltage divider with a voltage-dividing capacitor C1. As discussed previously, the capacitance for voltage-dividing capacitor C1 is larger than the drain-to-source capacitance for the high-voltage clamping transistor S2 (e.g, 50 times larger). The drain voltage lxc during the peak and valley detection period is thus just a fraction of the drain voltage lx. An RC network 305 phase-shifts the drain voltage lxc by 90 degrees to form a phase-shifted voltage that is compared by a peak and valley comparator 310 to a reference voltage that equals the common-mode voltage (midpoint) of the resonant oscillation amplitude for the drain voltage lxc. Due to the 90 degree phase shift, comparator 310 is directly detecting the peaks and valleys. In particular, depending upon the polarity of its inputs, the output of comparator 310 will either go high or low at the peaks for drain voltage lxc. For example, if comparator 310 receives the phase-shifted voltage at its non-inverting input, its output signal will transition to the power supply voltage at the peaks and will transition to ground at the valleys as detected by a valley/peak detection circuit 315. Conversely, the output signal from comparator 310 would transition low at the peaks if the phase-shifted voltage is received at inverting input for comparator 310. Note that dividing capacitor C1, RC network 305, comparators 335 and 310, and valley/peak detection circuit 315 may all be integrated within controller U1 but are shown separately for illustration purposes.

Figure 4:
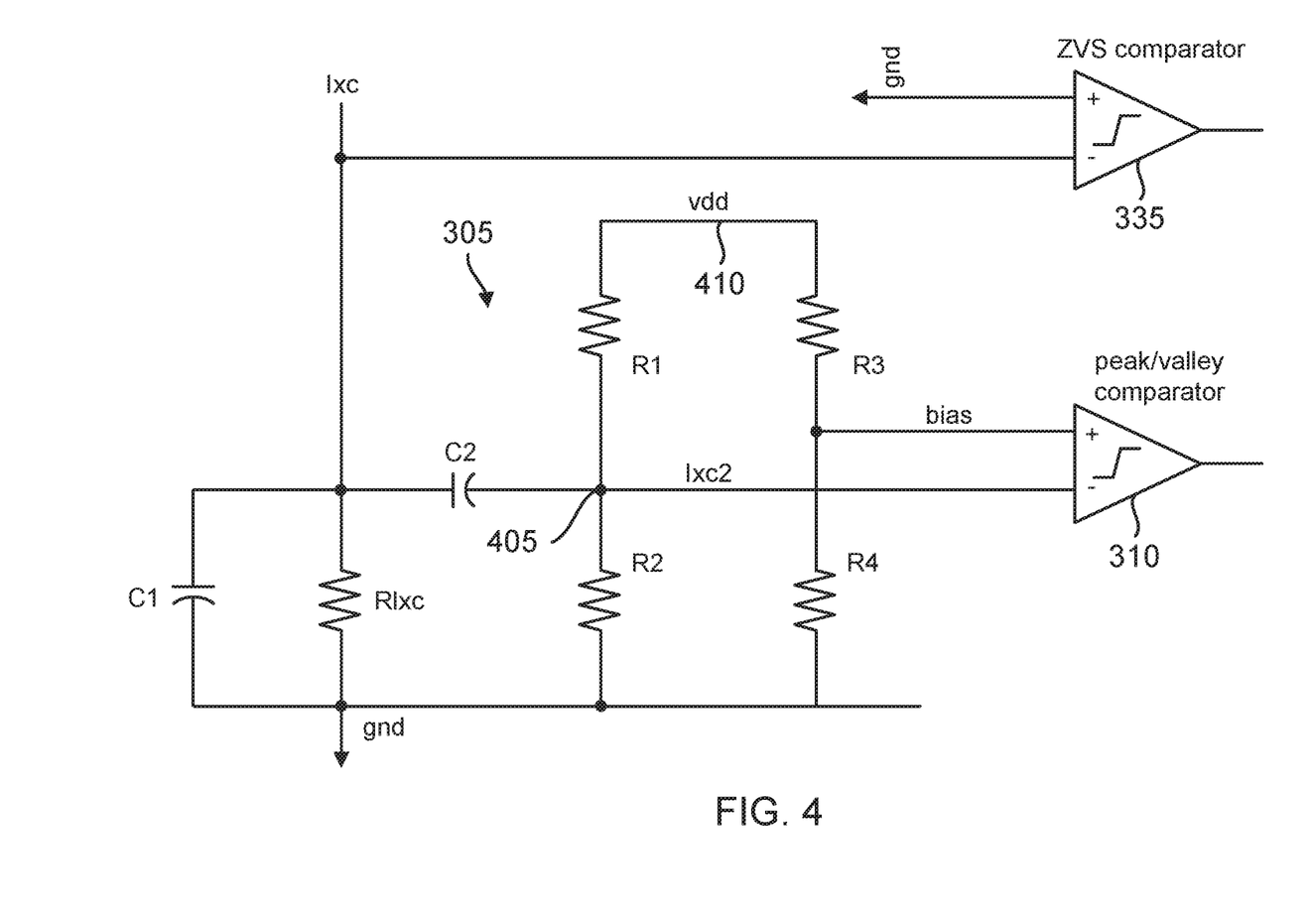
FIG. 4 is a more detailed view of portions of the flyback converter of FIG. 3 in accordance with an embodiment of the disclosure.

RC network 305 is shown in more detail in FIG. 4. The drain voltage lx of FIG. 3 is divided across voltage-dividing capacitor C1 to form divided drain voltage lxc. To filter low-frequency noise on the divided drain voltage lxc, voltage-dividing capacitor C1 couples in parallel with a resistor Rlxc. RC network 305 includes a capacitor C2 to capacitively couple the divided drain voltage lxc to a voltage lxc2 formed on voltage divider node 405 between a pair of voltage dividing resistors R1 and R2 that couple between a power supply node 410 for a power supply voltage VDD and ground. For example, resistors R1 and R2 may each have an equal resistance so that the DC voltage for node 410 is VDD/2. As divided voltage lxc resonantly oscillates, voltage lxc2 oscillates through the capacitive coupling provided by capacitor C2. But capacitor C2 phase shifts this oscillation by 90 degrees such that voltage lxc2 oscillates 90 degrees out of phase with divided voltage lxc. Another voltage divider formed by a pair of resistors R3 and R4 coupled between node 410 and ground form a reference voltage (bias). Resistors R3 and R4 may have the same dividing ratio as resistors R1 and R2 so the reference voltage equals the DC common-mode value for voltage lxc2. Comparators 310 and 335 function as discussed with regard to FIG. 3.

Figure 5:
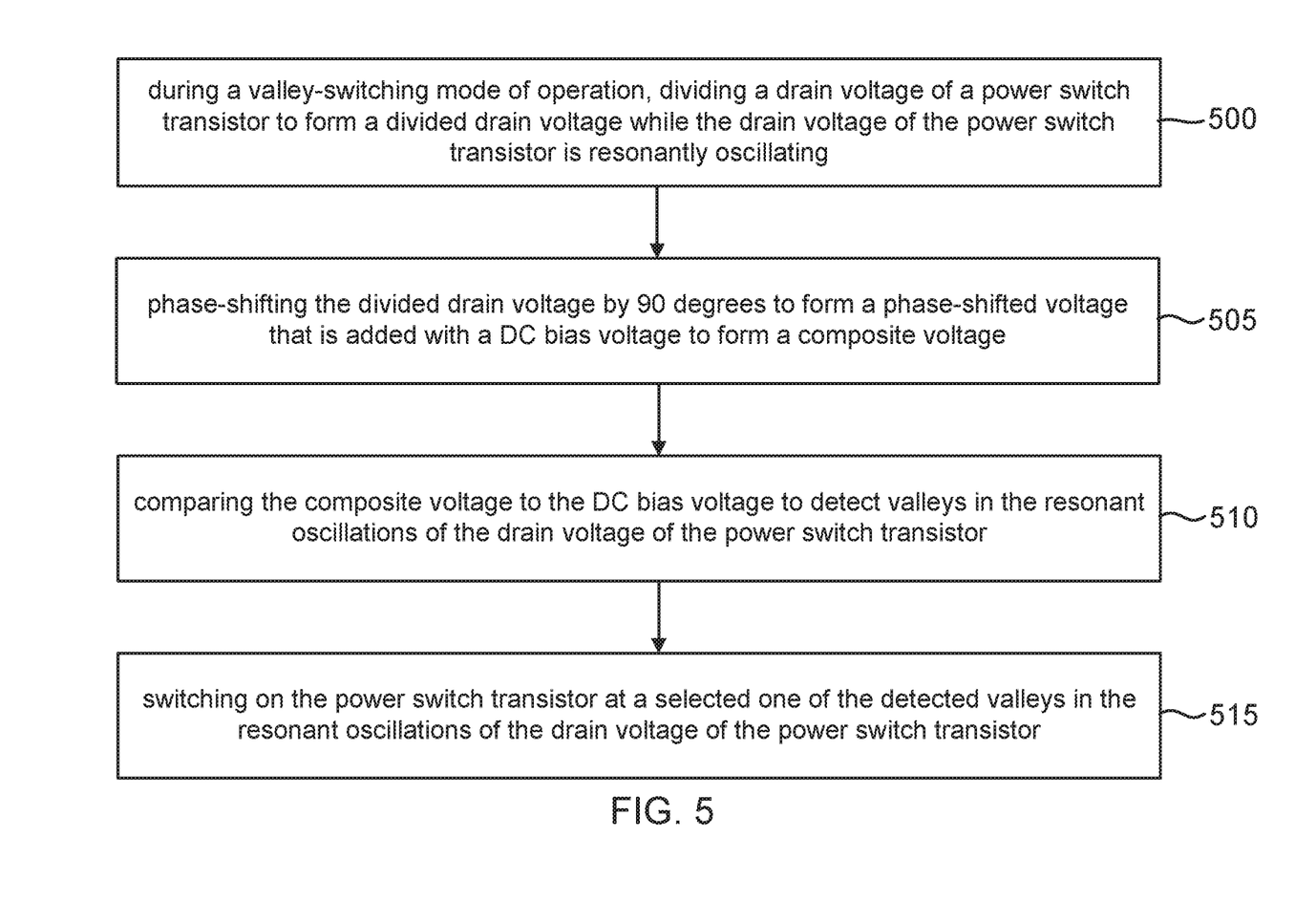
FIG. 5 is a flowchart for an example method of detecting peaks and valleys in accordance with an aspect of the disclosure.

A method for detecting the peaks and valleys during valley-mode operation will now be discussed with regard to the flowchart shown in FIG. 5. The method includes an act 500 of dividing a drain voltage of a power switch transistor to form a divided drain voltage while the drain voltage of the power switch transistor is resonantly oscillating as occurs during the valley-mode operation. The division by capacitor C1 and high-voltage clamping transistor S2 is an example of act 500. The method further includes an act 505 of phase-shifting the divided drain voltage by 90 degrees to form a phase-shifted voltage that is added with a DC bias voltage to form a composite voltage. The formation of the phase-shifted voltage lxc2 on node 405 is an example of act 505. In addition, the method includes an act 510 of comparing the composite voltage to the DC bias voltage to detect valleys in the resonant oscillations of the drain voltage of the power switch transistor. The comparison by comparator 310 is an example of act 510. Finally, the method includes an act 515 of switching on the power switch transistor at a selected one of the detected valleys in the resonant oscillations of the drain voltage of the power switch transistor. The switching on of power switch S1 at a desired valley is an example of act 515.

It will be appreciated that numerous modifications may be made to the preceding example embodiments. In an embodiment without ZVS operation, comparator 335 may be omitted. In addition, high-voltage clamping transistor S2 and voltage-dividing capacitor C1 may be replaced by a resistive voltage divider in such a valley-mode-switching-only embodiment. Thus, as those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A switching power converter, comprising:
a high-voltage clamping transistor having a first terminal connected to a first terminal of a power switch transistor;
a capacitor coupled between a second terminal of the high-voltage clamping transistor and ground;
a first voltage divider for dividing a terminal voltage for the first terminal of the power switch transistor into a divided voltage carried on a divided voltage node, wherein the first terminal of the power switch transistor is connected to a primary winding of a transformer, and wherein a second terminal of the power switch transistor is coupled to ground;
a second voltage divider for biasing a voltage divider node with a direct current (DC) bias voltage;
a capacitor coupled between the voltage divider node and the second terminal of the high-voltage clamping transistor, the capacitor being configured to phase-shift the divided voltage by 90 degrees to form a phase-shifted voltage on the voltage divider node that is added with the DC bias voltage to form a composite voltage;
a first comparator configured to compare the composite voltage to the DC bias voltage to detect peaks and valleys in a resonant oscillation of the terminal voltage of the power switch transistor; and
a controller configured to switch on the power switch transistor at a selected one of the detected valleys in the resonant oscillation of the terminal voltage of the power switch transistor.

2. The switching power converter of claim 1, wherein the terminal of the power switch transistor is a drain, the terminal voltage of the first terminal of the power switch transistor being a drain voltage, and wherein the divided voltage node is a divided drain voltage node.

3. The switching power converter of claim 2, wherein the first voltage divider comprises:
a high-voltage clamping transistor coupled between the drain of the power switch transistor and the divided drain voltage node; and
a voltage-dividing capacitor coupled between the divided drain voltage node and ground;
wherein the controller is further configured to switch off the high-voltage clamping transistor during a peak and valley detection mode.

4. The switching power converter of claim 3, wherein a capacitance of the voltage-dividing capacitor is larger than a drain-to-source capacitance for the high-voltage clamping transistor.

5. The switching power converter of claim 3, wherein the high-voltage clamping transistor is a GaN field effect transistor.

6. The switching power converter of claim 1, wherein the power switch transistor is a GaN field effect transistor.

7. The switching power converter of claim 3, wherein the controller is further configured to cycle the high-voltage clamping transistor on during a zero-voltage-switching mode, the switching power converter further comprising:
a zero-voltage-switching comparator configured to compare a drain voltage of the high-voltage clamping transistor to ground during the zero-voltage-switching mode to detect when the drain voltage of the power switch transistor crosses zero volts during the zero-voltage-switching mode.

8. The switching power converter of claim 3, wherein the second voltage divider comprises a first resistor coupled in series with a second resistor between a power supply voltage node and ground, and wherein the switching power converter comprises a third voltage divider including a third resistor coupled in series with a fourth resistor between the power supply voltage node and ground, and wherein the first comparator has a first input coupled to a first resistor node between the first resistor and the second resistor and has a second input coupled to a second resistor node between the third resistor and the fourth resistor.

9. The switching power converter of claim 8, wherein the first input is a non-inverting input and the second input is an inverting input.

10. The switching power converter of claim 8, wherein the controller is configured to cycle the power switch transistor on during a valley-switching mode in response to a comparator output signal from the first comparator having a logical zero value.

11. A method of operation for a flyback converter, comprising:
during a valley-switching mode of operation, dividing a drain voltage at a drain of a power switch transistor to form a divided drain voltage while the drain voltage of the power switch transistor is resonantly oscillating, wherein the drain of the power switch transistor is connected to a primary winding of a transformer, and wherein a drain of the power switch transistor is coupled to ground;
phase-shifting the divided drain voltage by 90 degrees to form a phase-shifted voltage that is added with a DC bias voltage to form a composite voltage;
comparing the composite voltage to the DC bias voltage to detect valleys in the resonant oscillations of the drain voltage of the power switch transistor; and
switching on the power switch transistor at a selected one of the detected valleys in the resonant oscillations of the drain voltage of the power switch transistor.

12. The method of claim 11, wherein dividing the drain voltage of the power switch transistor comprises dividing the drain voltage of the power switch transistor in a capacitive voltage divider using a drain-to-source capacitance of a high-voltage clamping transistor while the high-voltage clamping transistor is switched off.

13. The method of claim 12, further comprising:
during a zero-voltage switching mode, switching on the high-voltage clamping transistor to form a clamped version of the drain voltage for the power switch transistor; and
comparing the clamped version of the drain voltage of the power switch transistor to ground to detect when the drain voltage of the power switch transistor has crossed zero volts.

14. The method of claim 13, further comprising:
switching on the power switch transistor responsive to the detection that the drain voltage of the power switch transistor has crossed zero volts.

15. The method of claim 13, further comprising switching on an active clamp switch transistor during the zero-voltage switching mode responsive to a detection of a peak in the resonant oscillations of the drain voltage of the power switch transistor.

* * * * *